US 9,798,600 B2

(12) United States Patent
Ishii et al.

(10) Patent No.: US 9,798,600 B2
(45) Date of Patent: Oct. 24, 2017

(54) SEMICONDUCTOR MEMORY DEVICE

(71) Applicant: RENESAS ELECTRONICS CORPORATION, Tokyo (JP)

(72) Inventors: Yuichiro Ishii, Tokyo (JP); Atsushi Miyanishi, Tokyo (JP); Yoshikazu Saito, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 2 days.

(21) Appl. No.: 14/868,238

(22) Filed: Sep. 28, 2015

(65) Prior Publication Data

US 2016/0092293 A1 Mar. 31, 2016

(30) Foreign Application Priority Data

Sep. 29, 2014 (JP) ................... 2014-198687

(51) Int. Cl.
*G11C 29/00* (2006.01)
*G06F 11/07* (2006.01)

(52) U.S. Cl.
CPC ........ *G06F 11/0751* (2013.01); *G06F 11/073* (2013.01)

(58) Field of Classification Search
CPC ............... G06F 11/0751; G06F 11/073; G06F 12/0246; G11C 29/024; G11C 29/02; G11C 29/50; G11C 29/00; G11C 11/417; G11C 11/419; G11C 29/08; G11C 11/41; G11C 2029/5002; G11C 16/225
See application file for complete search history.

(56) References Cited

U.S. PATENT DOCUMENTS

| 2005/0128830 | A1* | 6/2005 | Nishihara | G11C 29/44 365/200 |
| 2007/0255981 | A1 | 11/2007 | Eto | |
| 2009/0037782 | A1* | 2/2009 | Hughes | G11C 29/024 714/53 |

(Continued)

FOREIGN PATENT DOCUMENTS

| JP | 2007-257791 A | 10/2007 |
| JP | 2010-73285 A | 4/2010 |
| JP | 2010-86120 A | 4/2010 |

*Primary Examiner* — Guerrier Merant
(74) *Attorney, Agent, or Firm* — McDermott Will & Emery LLP

(57) ABSTRACT

The present invention provides a semiconductor memory device that can perform failure detection of an address decoder by a simple method with a low area overhead. The semiconductor memory device includes: a first memory array having a plurality of first memory cells arrange in matrix; a plurality of word lines provided corresponding to each of the memory cell rows; an address decoder for selecting a word line from the word lines based on the input address information; a second memory array that is provided adjacent to the first memory array in the column direction, having a plurality of second memory cells able to read address information used in the selection of the previously stored word line, according to the selection of the word line extended to the second memory array; and a comparison circuit for comparing the input address information with the address information read from the second memory array.

6 Claims, 9 Drawing Sheets

(56) References Cited

U.S. PATENT DOCUMENTS

| | | | |
|---|---|---|---|
| 2013/0021864 A1* | 1/2013 | Deng .................... | G11C 29/50 365/201 |
| 2013/0339590 A1* | 12/2013 | Tsuruda .............. | G06F 12/0246 711/103 |
| 2014/0085982 A1* | 3/2014 | Asaoka .................. | G11C 16/06 365/185.17 |
| 2014/0268977 A1* | 9/2014 | Wang .................... | G11C 5/063 365/63 |

* cited by examiner

SEMICONDUCTOR MEMORY DEVICE

CROSS-REFERENCE TO RELATED APPLICATIONS

The disclosure of Japanese Patent Application No. 2014-198687 filed on Sep. 29, 2014 including the specification, drawings and abstract is incorporated herein by reference in its entirety.

BACKGROUND

The present disclosure relates to a semiconductor memory device, and more particularly, to failure diagnosis of an address decoder.

Information processors include microcontrollers, microprocessors, signal processors, image processors, voice processors and the like. A memory circuit is incorporated in the microcontroller which is an example of the information processors. The memory circuit includes a memory part to store data, and an address decoder in which an input signal of n bits is input to assert one signal of $2^n$ selected signals to select data stored in the memory part. The integration of a failure detection function into the memory circuit is becoming increasingly popular to improve safety and reliability of equipment including memory circuits such as the microcontroller described above.

ISO26262 (international functional safety standard for electric and electronic automotive systems) requires failure detection during operation of an address decoder of a static random access memory (SRAM).

For example, general techniques such as error-correcting code (ECC) and parity are used as the failure detection function of the memory part which is the data storage part of the memory circuit (see, for example, Patent Document 1 (Japanese Patent Application Laid-Open No. 2007-257791)).

However, the technique such as ECC or parity enables failure detection based on the data actually read from the memory part, so that if a failure is detected with this technique, it is difficult to determine whether the cause of the failure is in the memory part or in the address decoder. Thus, failure detection of the address decoder is required in the memory circuit in addition to failure detection of the memory part. In other words, not only determining whether the address is correctly decoded, but also determining whether another address is not selected is required.

From this point of view, Japanese Patent Application Laid-Open No. 2010-86120 (Patent Document 2) describes a technique for performing failure detection of the address decoder by generating an error detection signal from the address and data, writing the error detection signal in the memory together with the data, and when the data is read, comparing the error detection bit generated from the read address with the read error detection bit.

Further, Japanese Patent Application Laid-Open No. 2010-73285 (Patent Document 3) describes a technique for performing failure detection of the address decoder by inverting at least one bit of the input signal of the address decoder in the SRAM macro, and comparing with logic values of a predetermined bit signal pair.

SUMMARY

However, the technique described in Patent Document 2 writes the error detection bit into the memory each time the data is written, and has a problem that the power overhead is high. In addition, the memory space for storing error detection bits is required for the amount of row address signal×column address signal. Thus, there is a problem that the area overhead is also high.

Further, the technique described in Patent Document 3 has a problem that the circuit becomes complicated. The present disclosure has been made to solve the foregoing problems, and an object thereof is to provide a semiconductor memory device that can perform failure detection of an address decoder by a simple method and with a low area overhead.

These and other objects and advantages will become apparent from the following description of the present specification illustrated in the accompanying drawing.

According to an embodiment, a semiconductor memory device includes: a first memory array having a plurality of first memory cells arranged in matrix; a plurality of word lines provided corresponding to each of the memory cell rows; an address decoder for selecting a word line from the word lines based on the input address information; a second memory array that is provided adjacent to the first memory array in the column direction, and has a plurality of second memory cells able to read address information used in the selection of the word line stored in advance, according to the selection of the word line extended to the second memory array; and a comparison circuit for comparing the input address information with the address information read from the second memory array.

According to an embodiment, it is possible to perform failure detection to determine whether the address decoder operates normally, by a simple method of reading address information from the second memory array and comparing the read address information with the input address information.

DETAILED DESCRIPTION

Figure 1:
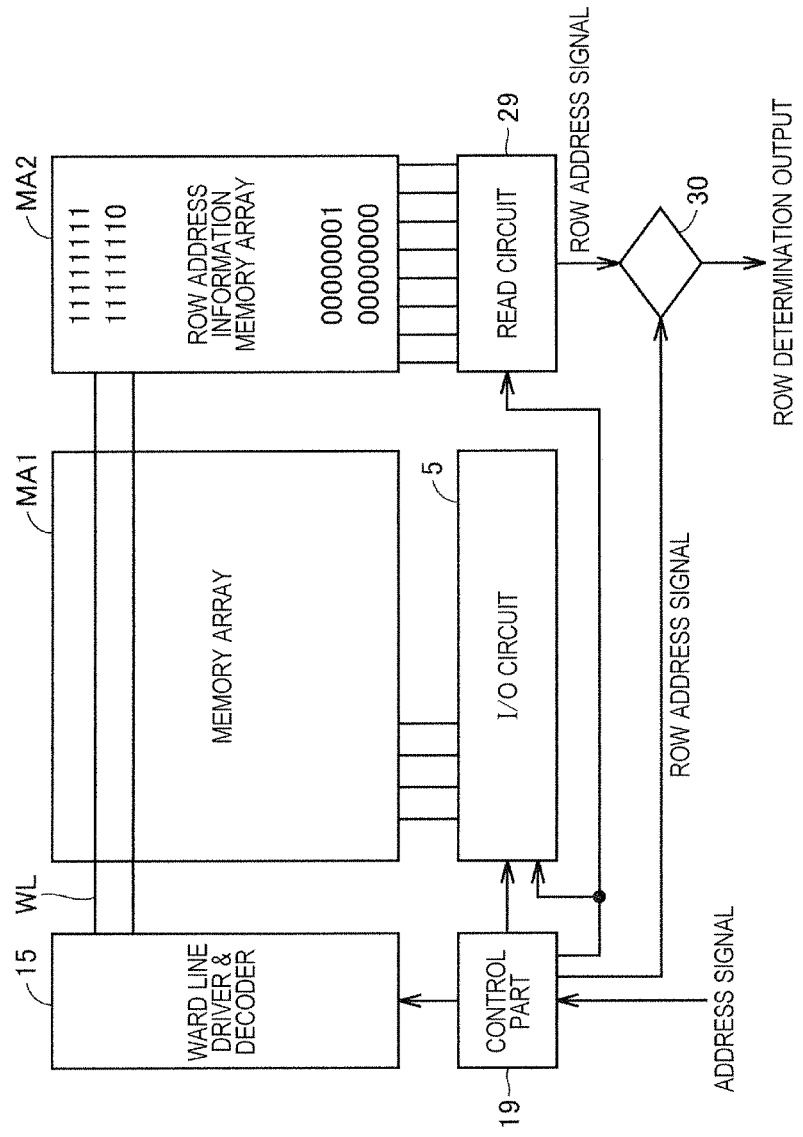
FIG. 1 is an overall block diagram of a semiconductor memory device according to a first embodiment.

Hereinafter, exemplary embodiments will be described in detail with reference to the accompanying drawings. Note that the same or like parts are denoted by the same reference numerals and a detailed description thereof will not be repeated.

First Embodiment

Referring to FIG. 1, a semiconductor memory device includes a word line driver & decoder 15, memory arrays MA1 and MA2, a control part 19, an I/O circuit 5, a read circuit 29, and a comparison circuit 30. Note that the decoder is the abbreviation for the address decoder.

The control part 19 controls each of the functional blocks of the semiconductor memory device. More specifically, the control part 19 outputs a row address signal to the word line driver & decoder 15 based on the input of the address signal. Further, the control part 19 outputs various signals to drive the I/O circuit 5 and the read circuit 29. Also, the control part 19 outputs the row address signal, which is output to the word line driver & decoder 15, to the comparison circuit 30.

The memory array MA1 has a plurality of memory cells arranged in matrix. The memory cells of the memory array MA1 are provided to be rewritable.

The memory array MA2 is provided adjacent to the memory array MA1 in the column direction, and has memory cells arranged in matrix. The memory cells of the memory array MA2 are provided to be non-rewritable. The memory array MA2 is configured in a read only memory.

In the present embodiment, the memory array MA2 stores row address information used in the selection of a word line. More specifically, the memory cell of a memory cell row coupled to a word line previously stores the word address information used in the selection of the particular word line.

The word line driver & decoder 15 drives the word line WL provided corresponding to each of the memory cell rows of the memory cells arranged in matrix in the memory arrays MA1 and MA2.

The word line WL extends so as to be common to the memory arrays MA1 and MA2.

The I/O circuit 5 is provided as an input and output circuit of the memory array MA1. The read circuit 29 reads information stored in the memory array MA2. In the present embodiment, the read circuit 29 reads information stored in the memory cell of the memory array MA2 according to the selection of the word line WL.

The comparison circuit 30 compares the information read from the memory array MA2 with the row address information output from the control part 19.

In the present embodiment, the row address information used in the selection of the word line is stored in the memory cells of the memory array MA2. Thus, the comparison circuit 30 compares the two pieces of address information and outputs the comparison result as a row determination output. More specifically, if the two pieces of row address information match, the row determination output is "0", and if they do not match the row determination output is "1".

When the row address information for selecting the word line WL from the word line driver & decoder 15 matches the row address information read from the memory array MA2 ("0"), the decoder is normal.

On the other hand, when the row address information for selecting the word line WL from the word line driver & decoder 15 does not match the row address information read from the memory array MA2 ("1"), the decoder is abnormal.

Figure 2:
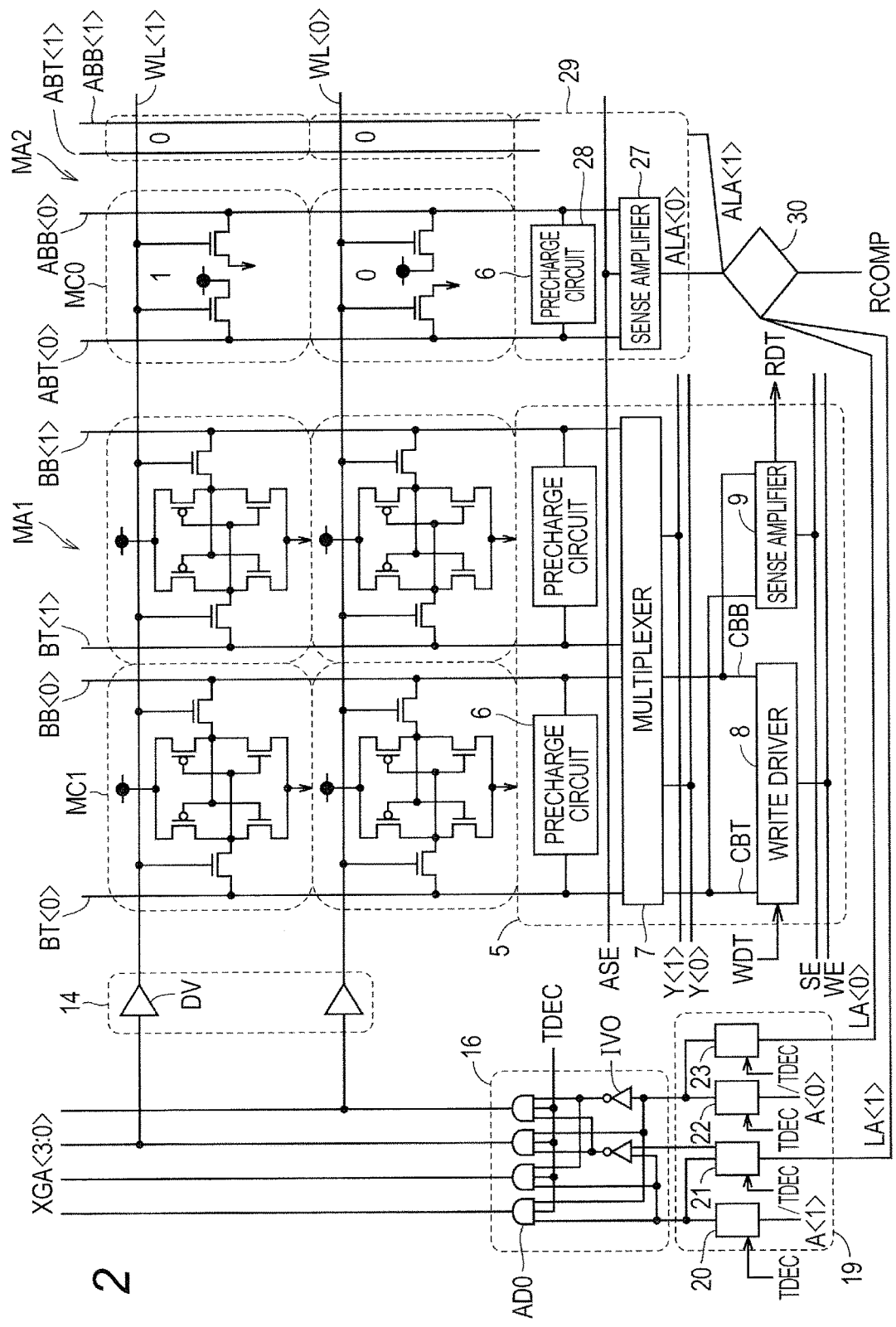
FIG. 2 is a detailed circuit block diagram of the semiconductor memory device according to the first embodiment.

FIG. 2 is a detailed circuit block diagram of the semiconductor memory device according to the first embodiment. Referring to FIG. 2, the word line driver & decoder 15 includes a word line driver 14 and a decoder 16.

The word line driver 14 includes a plurality of drivers DV provided corresponding to a plurality of word lines WL, each of which corresponds to each memory cell row.

The decoder 16 generates decode signals XGA <3:0> based on the row address information. Note that in the present embodiment, the symbol <X:0> means <X> to <0>.

The decoder 16 operates in synchronization with an internal clock signal TDEC. The decoder 16 includes a plurality of AND circuits AD0 as well as an inverter IV0. The internal clock signal TDEC is generated by an internal clock generation circuit, not shown, based on a clock signal CLK.

The present embodiment shows the case in which a 2-bit row address data (A<1>, A<0>) is used as an example of the row address information.

The decoder 16 sets one of the decode signals XGA <3:0> to "1" and the others to "0", based on the row address data A<1>, A<0>.

The word line driver 14 drives the word line WL according to the decode signals XGA <3:0>. One word line WL of the plurality of word lines WL is activated according to the row address information. The present embodiment shows the word lines WL<0> and WL<1> as an example.

The control part 19 includes latch circuits 20 to 23. The latch circuits 20 and 22 receive the input of the row address data A<1>, A<0> during the time when the internal clock signal TDEC is "0". Then, the latch circuits 20 and 22 output the row address data A<1>, A<0> to the decoder 16 (address decoder) and the latch circuits 21 and 23. Further, the latch circuits 20 and 22 hold the row address data A<1>, A<0> during the time when the internal clock signal TDEC is "1".

The latch circuits 21 and 23 receive latch data LA<1>, LA<0> from the latch circuits 20 and 22 during the time when the internal clock signal TDEC is "1". Further, the latch circuits 21 and 23 hold the latch data LA<1>, LA<0> from the latch circuits 20 and 22 during the time when the internal clock signal TDEC is "1". In other words, the latch data LA<0> and LA<1> are held for one cycle.

The memory array MA1 has a plurality of memory cells MC1 arranged in matrix. Each memory cell MC1 is a static random access memory (SRAM) cell which is provided to be rewritable. The present embodiment shows a six-transistor SRAM cell as an example. The details of the SRAM cell are known, so that a detailed description thereof will be omitted.

A plurality of word lines WL are provided corresponding to each of the memory cell rows of the memory array MA1. The present embodiment shows two of the four memory cell rows.

Further, a plurality of bit line pairs are provided corresponding to each of the memory cell columns of the memory array MA1. The present embodiment shows two memory cell columns. Two bit line pairs are arranged so as to correspond to the two memory cell columns. More specifically, bit lines BT<0>, BB<0>, BT<1>, and BB<1> are shown.

The I/O circuit 5 includes a precharge circuit 6 which is provided for each memory cell column, a multiplexer 7, a write driver 8, and a sense amplifier 9.

The precharge circuit 6 sets a corresponding bit line pair to a power supply voltage VCC in data read.

The multiplexer 7 selects a bit line pair according to decode signals Y<1>, Y<0>.

In the present embodiment, the decode signals Y<1> and Y<0> are generated based on the column address data B of 1 bit by a column decoder not shown.

The multiplexer 7 couples the bit line pair to the data line pair CBT, CBB according to the decode signals Y<1>, Y<0>. For example, when the decode signal Y<1> is "1", the bit line pair BT<0>, BB<0> is electrically coupled to the data line pair CBT, CBB.

On the other hand, when the decode signal Y<0> is "1", the bit line pair BT<1>, BB<1> is electrically coupled to the data line pair CBT, CBB.

The write driver 8 writes data to the memory array MA1 according to the write data WDT in data write. More specifically, the write driver 8 is activated in response to an activation signal WE, and drives the data line pair CBT, CBB based on the write data WDT. As an example, the write driver 8 sets the data line pair CBT, CBB to "1", "0" when the write data WDT is "1". Because of this setting, the bit line pair coupled to the data line pair CBT, CBB is driven through the multiplexer 7. Then, the data is written in the memory cell MC corresponding to the selected word line WL.

The sense amplifier 9 is activated in response to an activation signal SE, and outputs read data RDT from the memory array MA1 in data read. More specifically, when the data is read, the sense amplifier 9 is activated in response to the activation signal SE, amplifies the potential difference transmitted to the bit line pair coupled to the data line pair CBT, CBB according to the data held by the memory cell MC1, and outputs the read data RDT. The bit line pair is coupled to the data line pair through the multiplexer 7 in response to the decode signal Y.

The memory array MA2 has a plurality of memory cells MC0 arranged in matrix. Each memory cell MO is a ROM cell with data fixed. The present embodiment shows an example of a two-transistor ROM cell. The details of the ROM cell are known, so that a detailed description thereof will be omitted. The ROM cell is realized by coupling the source of the two transistors to the power supply voltage or the ground voltage. For example, the data "1" is held by coupling the source of the transistor coupled to the bit line ABT<0> of the bit line pair ABT<0>, ABB<0> to the power supply voltage, and by coupling the source of the transistor coupled to the bit line ABB<0> to the ground voltage. On the other hand, the data "0" is held by coupling the source of the transistor coupled to the bit line ABT<0> of the bit line pair ABT<0>, ABB<0> to the ground voltage, and by coupling the source of the transistor coupled to the bit line ABB<0> to the power supply voltage.

Common word lines are provided in such a way that the word lines of the memory array MA1 extend corresponding to the memory cell rows of the memory array MA2. The present embodiment shows two of the four memory cell rows.

Further, a plurality of bit line pairs are provided corresponding to each of the memory cell columns of the memory array MA2. The present embodiment shows two memory cell columns. Two bit line pairs are arranged so as to correspond to the two memory cell columns. More specifically, the bit lines ABT<0>, ABB<0>, ABT<1>, and ABB<1> are shown.

The read circuit 29 includes a precharge circuit 28 that is provided for each memory cell column, as well as a sense amplifier 27.

The precharge circuit 28 sets a corresponding bit line pair to the power supply voltage VCC in data read.

The sense amplifier 27 is activated in response to an activation signal ASE, and outputs read data ALA from the memory array MA2 in data read. More specifically, when the data is read, the sense amplifier 27 is activated in response to the activation signal ASE, amplifies the potential difference transmitted to the bit line pair according to the data held by the memory cell MC0, and outputs the read data ALA.

In the present embodiment, 2-bit read data ALA<0>, ALA<1> is output. The comparison circuit 30 compares the information read from the memory array MA2 with the row address information output from the control part 19.

More specifically, the comparison circuit 30 compares the latch data LA<0>, LA<1> held by the latch circuits 21 and 23 of the control part 19, with the read data ALA<0>, ALA<1> output from the sense amplifier 27 of the memory array MA2, respectively.

When the latch data LA<0> and the read data ALA<0> match and when the latch data<1> and the read data ALA<1> match, a row determination output signal RCOMP is set to "0".

On the other hand, when the latch data LA<0> and the read data ALA<0> do not match or when the latch data LA<1> and the read data ALA<1> do not match, the row determination output signal RCOMP is set to "1".

It is possible to perform failure detection of the decoder 16 in response to the row determination output signal RCOMP.

In the memory array MA2, address information "00" used in the selection of the word line WL<0> is stored in the memory cell MC0 corresponding to the word line WL<0>. Further, address information "01" used in the selection of the word line WL<1> is stored in the memory cell MC0 corresponding to the word line WL<1>. Note that the other memory cells of the memory array MA2 store address information in the same way as in the memory cell MC0.

Figure 3:
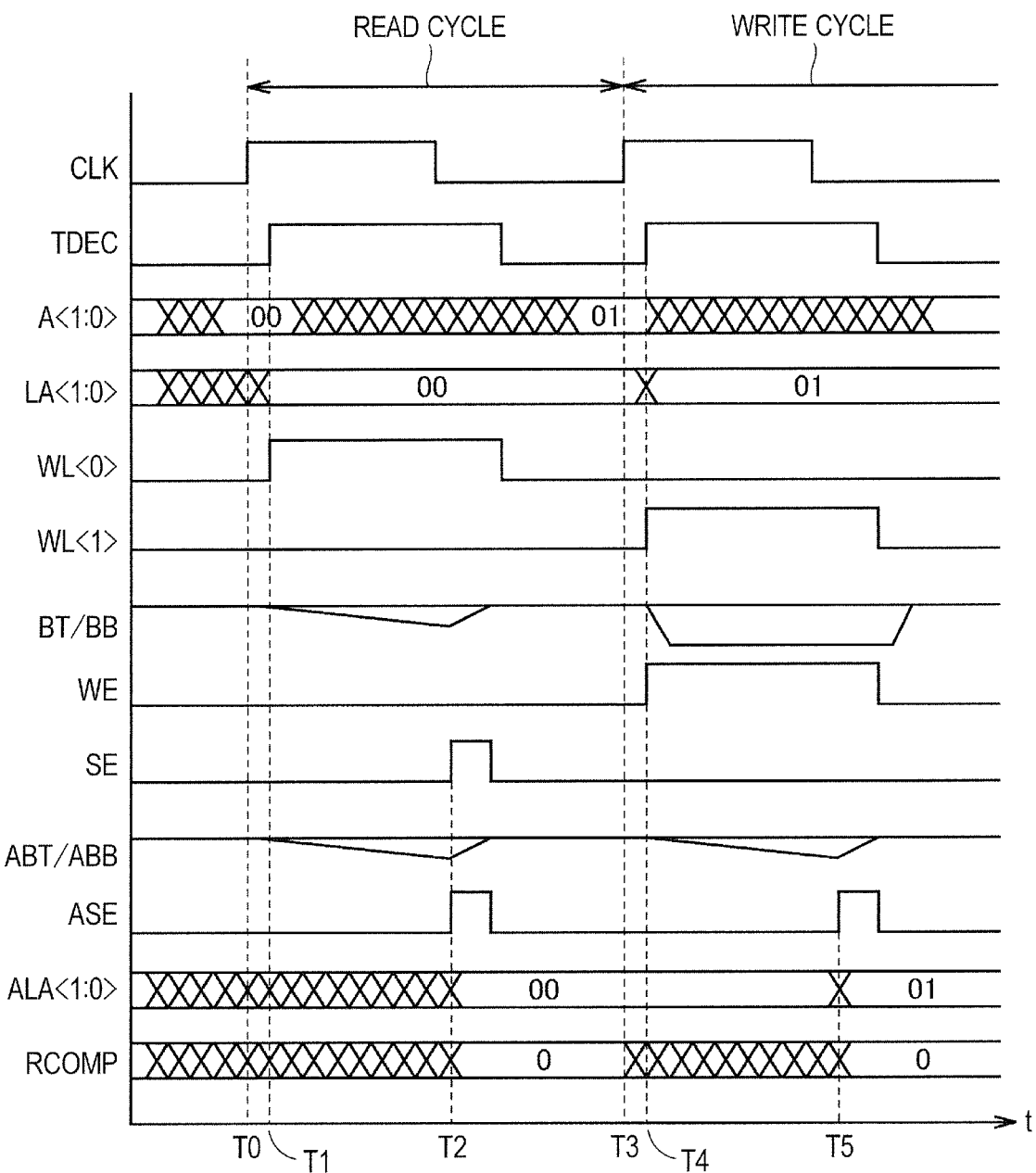
FIG. 3 is a timing chart showing the data read and write of the semiconductor memory device according to the first embodiment.

FIG. 3 is a timing chart showing the data read and write of the semiconductor memory device according to the first embodiment.

First, data read (read cycle) shown in FIG. 3 will be described as an example.

The semiconductor memory device operates in synchronization with the clock signal CLK. In the present embodiment, the clock signal CLK rises at time T0 as an example.

Next, the latch circuits 20 and 22 latch the input of the row address data A<1>, A<0> in synchronization with the rise of the internal clock signal TDEC at time T1. In the present embodiment, the input of "00" is latched as the row address data A<1> and A<0>.

The latch circuits 21 and 23 are turned through in synchronization with the rise of the internal clock signal TDEC. In this way, the latch circuits 21 and 23 output "00" as the latch data LA<1>, LA<0>.

Further, the decoder 16 generates the decode signal XGA <3:0> based on the row address data A<1>, A<0> in synchronization with the rise of the internal clock signal TDEC.

The present embodiment shows the case in which the word line WL<0> is selected based on the input of the row address data A<1>, A<0>("00").

In this way, data is read to the bit line pair BT, BB from the corresponding memory cell MC1 in response to the selection of the word line WL<0>.

Then, at time T2, the sense amplifier 9 amplifies the potential difference of the bit line pair BT, BB to generate read data in response to the activation of the activation signal SE.

Further, the data is read to the bit line pair ABT, ABB from the corresponding memory cell MC0 in response to the selection of the word line WL<0>.

Further, at time T2, the sense amplifier 27 amplifies the potential difference of the bit line pair ABT, ABB to generate read data in response to the activation of the activation signal ASE. The present embodiment shows the case in which "00" is read as the read data ALA<1>, ALA<0>.

The comparison circuit 30 compares "00" as the read data ALA<1>, ALA<0> read from the memory array MA2, with "00" as the latch data LA<1>, LA<0>. In this case they match, so that the comparison circuit 30 outputs the row determination output signal RCOMP ("0"). In this way, it is possible to detect normal operation.

Next, the data write (write cycle) will be described. The semiconductor memory device operates in synchronization with the clock signal CLK. In the present embodiment, the clock signal CLK rises at time T3 as an example.

Next, the latch circuit 20 and 22 latch the input of the row address data A<1>, A<0> in synchronization with the rise of the internal clock signal TDEC at time T4. In the present embodiment, the input of "01" is latched as the row address data A<1>, A<0>.

The latch circuits 21 and 23 are turned through in synchronization with the rise of the internal clock signal TDEC. In this way, the latch circuits 21 and 23 output "01" as the latch data LA<1>, LA<0>.

Further, the decoder 16 generates the decode signal XGA <3:0> based on the row address data A<1>, A<0> in synchronization with the rise of the internal clock signal TDEC.

The present embodiment shows the case in which the word line WL<1> is selected based on the input of the row address data A<1>, A<0>("01").

Further, in the present embodiment, the write driver 8 is activated in response to the activation signal WE, and then data is written to the corresponding memory cell MC0 according to the selection of the word line WL<1>.

Further, in the present embodiment, the data is read from the corresponding memory cell MC0 into the bit line pair ABT, ABB in response to the selection of the word line WL<1>, in parallel to the data read.

Then, at time T5, the sense amplifier 27 amplifies the potential difference of the bit line pair ABT, ABB to generate read data in response to the activation of the activation signal ASE.

In the present embodiment, "01" is read as the read data ALA<1>, ALA<0>.

The comparison circuit 30 compares "01" as the read data ALA<1>, ALA<0> read from the memory array MA2, with "01" as the latch data LA<1>, LA<0>. In this case they match, so that the comparison circuit 30 outputs the row determination output signal RCOMP ("0"). In this way, it is possible to detect normal operation.

Figure 4:
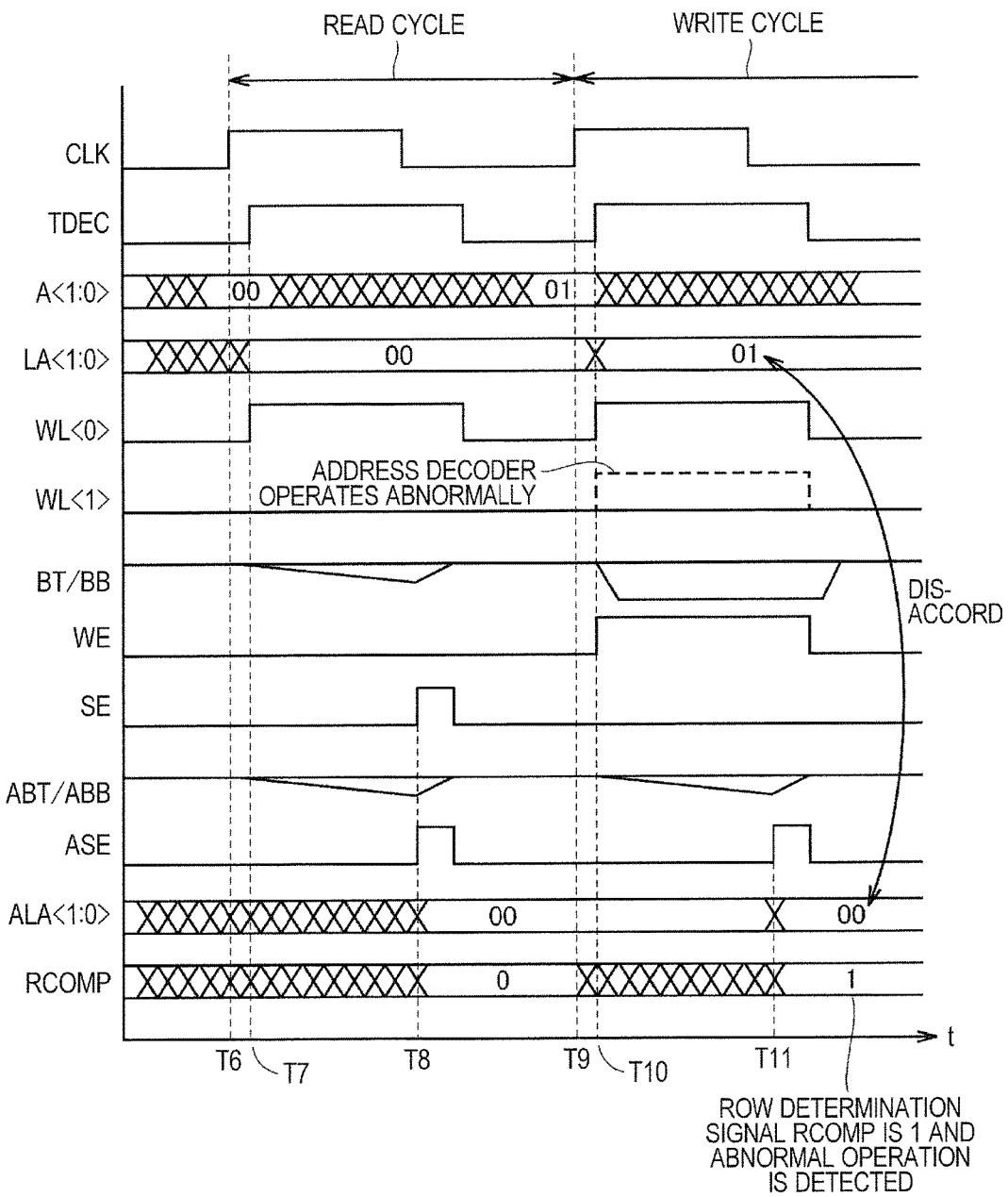
FIG. 4 is another timing chart showing the data read and write of the semiconductor memory device according to the first embodiment.

FIG. 4 is another timing chart showing the data read and write of the semiconductor memory device according to the first embodiment.

First, the data read (read cycle) shown in FIG. 4 will be described as an example.

The semiconductor memory device operates in synchronization with the clock signal CLK. In the present embodiment, the clock signal CLK rises at time T6 as an example.

Next, the latch circuits 20 and 22 latch the input of the row address data A<1>, A<0> in synchronization with the rise of the internal clock signal TDEC at time T7. In the present embodiment, the input of "00" is latched as the row address data A<1>, A<0>.

The latch circuit 21 and 23 are turned through in synchronization with the rise of the internal clock signal TDEC. In this way, the latch circuits 21 and 23 output "00" as the latch data.

Further, the decoder 16 generates the decode signal XGA <3:0> based on the row address data A<1>, A<0> in synchronization with the rise of the internal clock signal TDEC.

The present embodiment shows the case in which the word line WL<0> is selected based on the input of the row address data A<1>, A<0>("00").

In this way, the data is read from the corresponding memory cell MC1 into the bit line pair BT, BB according to the selection of the word line WL<0>.

Then, at time T8, the sense amplifier 9 amplifies the potential difference of the bit line pair BT, BB to generate read data in response to the activation of the activation signal SE.

Further, data is read from the corresponding memory cell MC0 into the bit line pair ABT, ABB according to the selection of the word line WL<0>.

Further, at time T8, the sense amplifier 27 amplifies the potential difference of the bit line pair ABT, ABB to generate read data in response to the activation of the activation signal ASE. The present embodiment shows the case in which "00" is read as the read data ALA<1>, ALA<0>.

The comparison circuit 30 compares "00" as the read data ALA<1>, ALA<0> read from the memory array MA2 with "00" as the latch data LA<1>, LA<0>. In this case they match, so that the comparison circuit 30 outputs the row determination output signal RCOMP ("0"). In this way, it is possible to detect normal operation.

Next, the data write (write cycle) will be described. The semiconductor memory device operates in synchronization with the clock signal CLK. In the present embodiment, the clock signal rises at time T9 as an example.

Next, the latch circuits 20 and 22 latch the input of the row address data A<1>, A<0> in synchronization with the rise of the internal clock signal TDEC at time T10. In the present embodiment, the input of "01" is latched as the row address data A<1>, A<0>.

The latch circuits 21 and 23 are turned through in synchronization with the rise of the internal clock signal TDEC. In this way, the latch circuits 21 and 23 output "01" as the latch data LA<1>, LA<0>.

Further, the decoder 16 generates the decode signal XGA <3:0> based on the row address data A<1>, A<0> in synchronization with the rise of the internal clock signal TDEC.

The present embodiment shows the case in which the word line WL<1> is selected based on the input of the row address data A<1>, A<0>("0").

Further, in the present embodiment, the write driver 8 is activated in response to the activation signal WE, and then data is written in the corresponding memory cell MC0 according to the selection of the word line WL<1>.

Further, in the present embodiment, data is read from the corresponding memory cell MC0 into the bit line pair ABT, ABB, according to the selection of the word line WL<1>, in parallel to the data write.

Then, at time T11, the sense amplifier 27 amplifies the potential difference of the bit line pair ABT, ABB to generate read data in response to the activation of the activation signal ASE.

The present embodiment shows the case in which "00" is read as the read data ALA<1>, ALA<0> due to abnormal operation of the decoder 16.

The comparison circuit 30 compares "00" as the read data ALA<1>, ALA<0> read from the memory array MA2 with "01" as the latch data LA<1>, AL<0>. In this case they do no match, so that the comparison circuit 30 outputs the row determination output signal RCOMP ("1"). In this way, it is possible to detect abnormal operation.

Thus, in the semiconductor memory device according to the first embodiment, it is possible to perform failure detection to determine whether the address decoder operates correctly by a simple method of reading the address information stored in the memory array MA2 and comparing the read address information with the input address information.

Further, in the semiconductor memory device according to the first embodiment, not only in the data read but also in the data write, it is possible to perform failure detection to determine whether the address decoder operates normally, by reading the address information stored in the memory array MA2, reading the input address information, and comparing the read address information with the input address information.

In the semiconductor memory device according to the first embodiment, the memory array MA2 includes two-transistor ROM cells, and can perform failure detection of the address decoder with a small area and with a low area overhead as compared to the six-transistor SRAM cell. Further, the write operation is not performed on the memory array MA2, so that the power consumption is small. In addition, it is possible to perform failure detection of the address decoder also in data write, allowing highly accurate failure detection.

Second Embodiment

In the semiconductor memory device, one array is typically provided but may also be divided into a plurality of arrays and installed.

In the second embodiment, a description will be made of the case in which one array is divided into two SRAM macros (memory chips 35 and 36) and installed on the semiconductor memory device.

Figure 5:
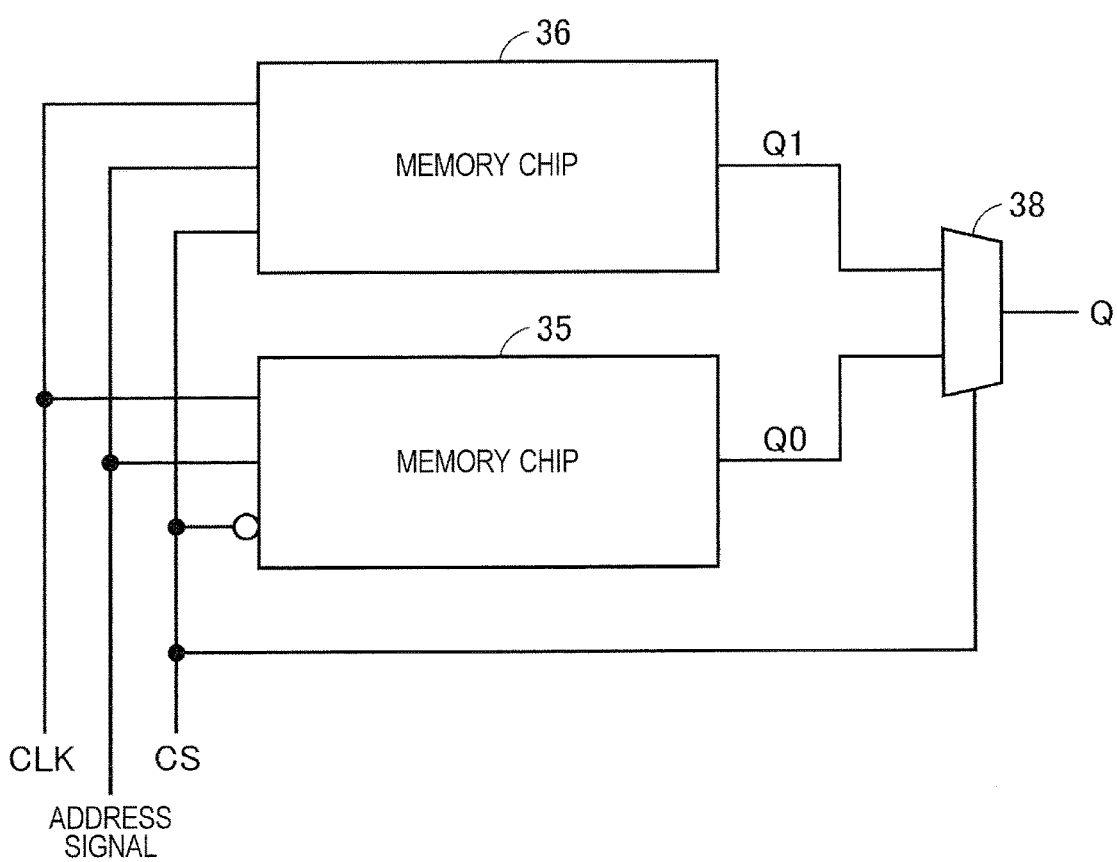
FIG. 5 is a schematic diagram showing a semiconductor memory device according to a second embodiment.

FIG. 5 is a schematic diagram showing a semiconductor memory device according to the second embodiment. Referring to FIG. 5, the semiconductor memory device according to the second embodiment includes two memory chips 35 and 36.

The memory chips 35 and 36 operate in a complementary manner. More specifically, the memory chips 35 and 36 are selected in response to a chip select signal CS. As an example, when the chip select signal CS is "0", the memory chip 35 operates and the memory chip 36 does not operate. On the other hand, when the chip select signal CS is "1", the memory chip 35 does not operate while the memory chip 36 operates.

Further, a selector 38 is provided to switch a data output Q in response to the chip selector signal CS. More specifically, when the chip select signal CS is "1", data output Q1 of the memory chip 36 is output as the data output Q. When the chip select signal CS is "0", data output Q0 of the memory chip 35 is output as the data output Q.

The clock signal CLK and address signal are input to the memory chips 35 and 36. In the second embodiment, a description will be made of the case in which only one memory chip operates, namely, the data is output. However, both the memory chips 35 and 36 operate in parallel in the decode process by the address decoder.

Figure 6:
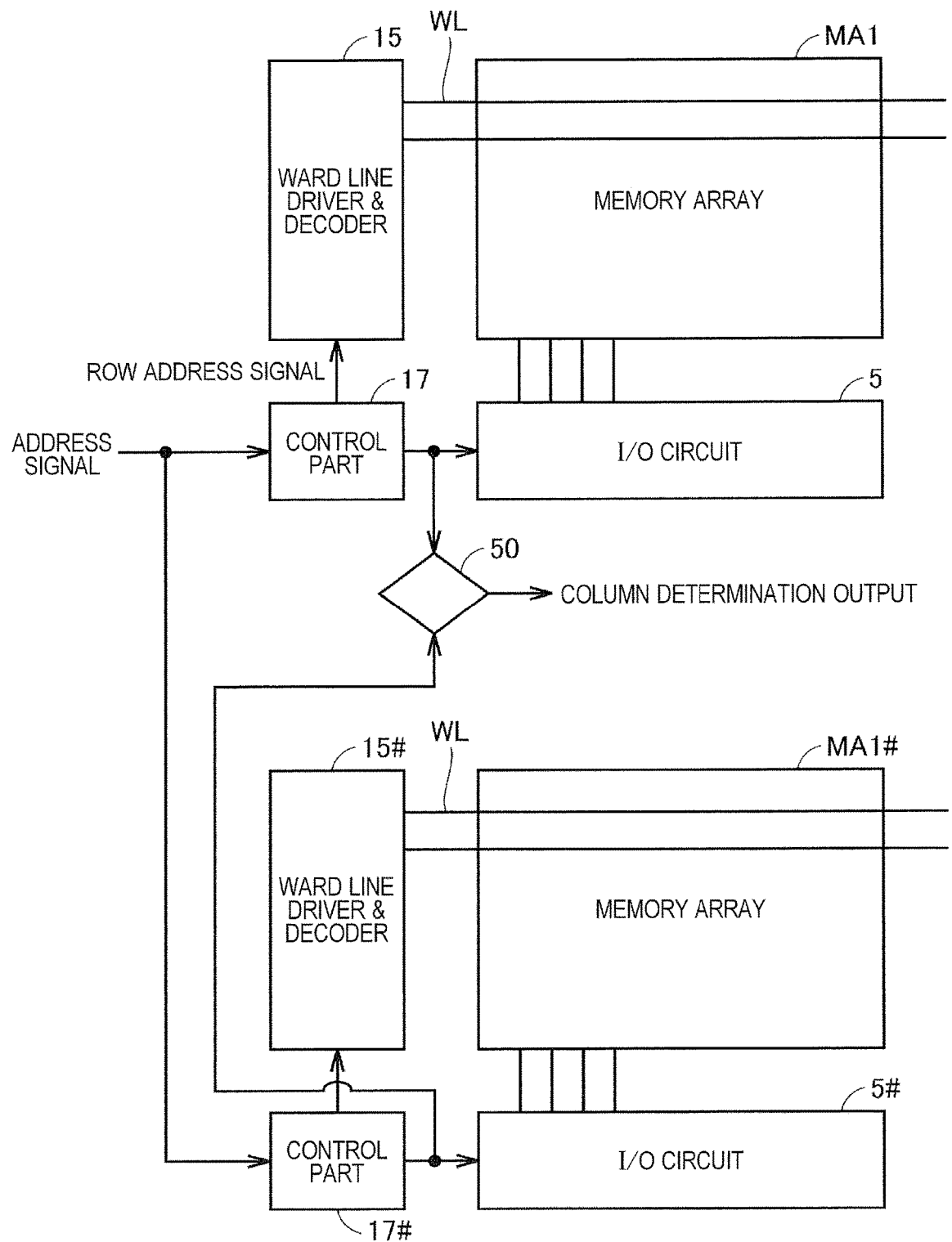
FIG. 6 is an overall block diagram of the memory chips 35, 36 according to the second embodiment.

FIG. 6 is an overall block diagram of the memory chips 35 and 36 according to the second embodiment. Referring to FIG. 6, the memory chip 35 or 36 includes word line driver & decoder 15 or 15#, a memory array MA1 or MA1#, a control part 17 or 17#, an I/O circuit 5 or 5#, and a comparison circuit 50. Note that the decoder is the abbreviation for the address decoder.

The control part 17 or 17# controls each of the functional blocks of the memory chip. More specifically, the control part 17 outputs a row address signal to the word line driver & decoder 15 based on the input of the address signal. Further, the control part 17 outputs various signals to drive the I/O circuit 5. In addition, in the present embodiment, the control part 17 includes a column decoder to output a decode signal to drive the I/O circuit 5. The column decoder also outputs a decode signal to the comparison circuit 50.

The control part 17# outputs a row address signal to the word line driver & decoder 15# based on the input of the address signal. Further, the control part 17# outputs various signals to drive the I/O circuit 5#. In addition, in the present embodiment, the control part 17# includes a column decoder to output a decode signal to drive the I/O circuit 5#. The column decoder also outputs a decode signal to the comparison circuit 50.

The comparison circuit 50 compares the decode signals for selecting columns, which are respectively output from the control parts 17 and 17#. As a result of the comparison, when they match (column determination output "0"), the comparison circuit 50 determines that the column decoders are normal.

On the other hand, when the comparison circuit 50 compares the decode signals for selecting columns, which are respectively output from the control parts 17 and 17#. As a result of the comparison, when they do not match (column determination output "1"), the comparison circuit 50 determines that the column decoders are abnormal.

Each of the memory arrays MA1 and MA1# includes a plurality of memory cells arranged in matrix. The memory cells of the memory array MA1 are provided to be rewritable.

Each of the word line driver & decoders 15 and 15# drives the word lines WL provided corresponding to each of the memory cell rows that are arranged in matrix in each of the memory arrays MA1 and MA1#.

Each of the I/O circuits 5 and 5# is provided as an input and output circuit of each of the memory arrays MA1 and MA1#.

In the second embodiment, a description will be made of the case in which only one memory chip operates. However, both the control parts 17 and 17#, as well as the comparison circuit 50 operate in parallel.

Figure 7:
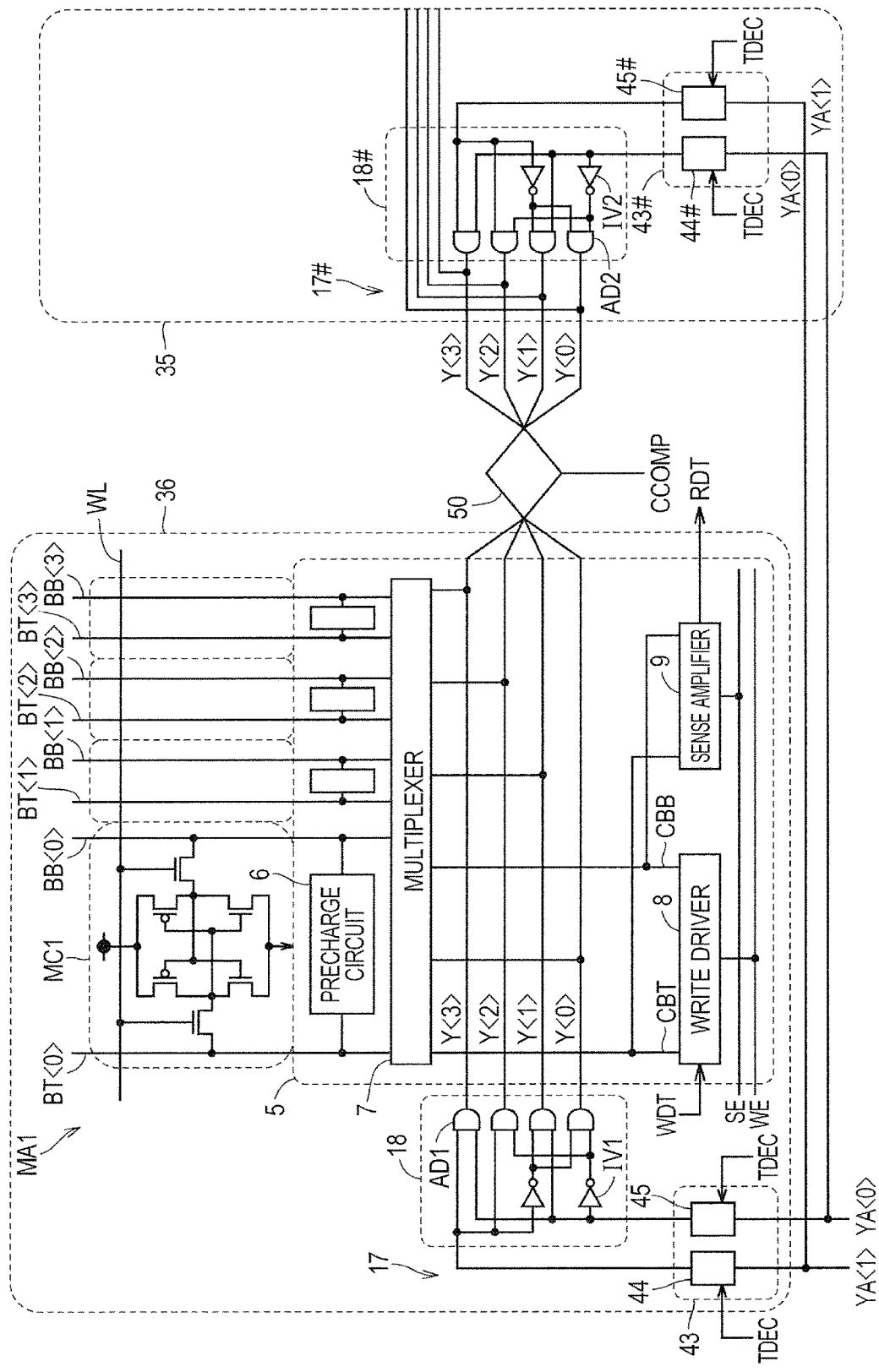
FIG. 7 is a detailed circuit block diagram of the semiconductor memory device according to the second embodiment.

FIG. 7 is a detailed circuit block diagram of the semiconductor memory device according to the second embodiment. Referring to FIG. 7, the circuit configuration of column selection system is shown here.

In the memory chip 36, the control part 17 includes a column decoder 18 and a latch circuit group 43.

The column decoder 18 includes a plurality of AND circuits AD1 as well as an inverter IV1. The column decoder 18 generates decode signals Y0<0> to Y0<3> based on the column address data.

The present embodiment shows the case in which 2-bit column address data (YA<1>, YA<0>) is used as an example of the column address information.

The column decoder 18 sets one of the decode signals Y0<0> to Y0<3> to "1" and the others to "0", based on the column address data YA<1>, YA<0>.

The multiplexer 7 couples the bit line pair and the data line pair according to the decode signals Y0<0> to Y0<3>.

The latch circuit group 43 includes latch circuits 44 and 45. The latch circuits 44 and 45 receive the input of the column address data YA<1>, YA<0> during the time when the internal clock signal TDEC is "0", and outputs to the column decoder 18 (address decoder).

Further, the latch circuits 44 and 45 hold (latch) the column address data YA<1>, YA<0> during the time when the internal clock signal TDEC is "1".

The memory array MA1 has a plurality of memory cells MC1 arranged in matrix. Each memory cell MC1 is a static random access memory (SRAM) which is provided to be rewritable. The present embodiment shows a six-transistor SRAM cell as an example. The details of the SRAM cell are known, so that a detailed description thereof will be omitted.

A plurality of word lines WL are provided corresponding to each of the memory cell rows of the memory array MA1.

Further, a plurality of bit line pairs are provided corresponding to each of the memory cell columns of the memory array MA1. The present embodiment shows four memory cell columns. Four bit line pairs are arranged so as to correspond to the four memory cell columns. More specifically, bit lines BT<0>, BB<0>, BT<1>, BB<1>, BT<2>, BB<2>, BT<3>, and BB<3> are shown.

The I/O circuit 5 includes a precharge circuit 6 which is provided for each memory cell column, a multiplexer 7, a write driver 8, and a sense amplifier 9.

The precharge circuit 6 sets the corresponding bit line pair to the power supply voltage VCC in data read.

The multiplexer 7 selects a bit line pair according to the decode signals Y0<3>, Y0<2>, Y0<1>, and Y0<0>.

In the present embodiment, the decode signals Y0<3> to Y0<0> are generated based on the 2-bit column address data YA by the column decoder 18.

The multiplexer 7 couples the bit line pairs to the data line pair CBT, CBB according to the decode signals Y0<3> to Y0<0>. As an example, when the decode signal Y0<0> is "1", the bit line pair BT<0>, BB<0> is electrically coupled to the data line pair CBT, CBB.

Further, when the decode signal Y0<1> is "1", the bit line pair BT<1>, BB<1> is electrically coupled to the data line pair CBT, CBB. The same is done for the other bit line pairs.

The write driver 8 writes data to the memory array MA1 according to the write data WDT in data write. More specifically, the write driver 8 is activated in response to the activation signal WE, and drives the data line pair CBT, CBB based on the write data WDT. As an example, the write driver 8 sets the data line pair CBT, CBB to "1", "0" when the write data WDT is "1". Because of this setting, the bit line pair coupled to the data line pair CBT, CBB is driven through the multiplexer 7. Then, the data is written in the memory cell MC corresponding to the selected word line WL.

The sense amplifier 9 is activated in response to the activation signal SE, and outputs the read data RDT from the memory array MA1 in data read. More specifically, when the data is read, the sense amplifier 9 is activated in response to the activation signal SE, amplifies the potential difference transmitted to the bit line pair coupled to the data line pair CBT, CBB according to the data held by the memory cell MC1, and outputs the read data RDT. The bit line pair is coupled to the data line pair through the multiplexer 7 according to the decode signals Y0<0> to Y0<3>.

The basic configuration of the memory chip 35 is the same as that of the memory chip 36. The control part 17# includes a column decoder 18# and a latch circuit group 43#.

The latch circuit group 43# includes latch circuits 44# and 45#. The latch circuit 44# and 45# receive the input of the column address data YA<1>, YA<0> during the time when the internal clock signal TDEC is "0", and output to the column decoder 18# (address decoder).

Further, the latch circuits 44# and 45# hold (latch) the column address data YA<1>, YA<0> during the time when the internal clock signal TDEC is "1".

The column decoder 18# includes a plurality of AND circuits AD2 and an inverter IV2. The column decoder 18# generates a decode signal based on the column address data YA<1>, YA<0>.

The present embodiment shows the case in which 2-bit column address data (YA<1>, YA<0>) is used as an example of the column address information.

The column decoder 18# sets one of the decode signals Y1<0> to Y1<3> to "1" and the others to "0", based on the column address data YA<1>, YA<0.

The selectin operation by the multiplexer is performed according to the decode signals Y1<0> to Y1<3>.

The comparison circuit 50 compares the decode signals Y0<0> to Y0<3> and Y1<0> to Y1<3>, respectively.

More specifically, the comparison circuit 50 compares the decode signal Y0<0> and the decode signal Y1<0>, the decode signal Y0<1> and the decode signal Y1<1>, the decode signal Y0<2> and the decode signal Y1<2>, and the decode signal Y0<3> and the decode signal Y1<3>, respectively.

If all the decode signals match, a column determination output signal CCOMP is set to "0". On the other hand, if any of these decode signals does not match, the column determination output signal CCOMP is set to "1".

It is possible to perform failure detection of the column decoders 18 and 18# according to the column determination output signal CCOMP.

Figure 8:
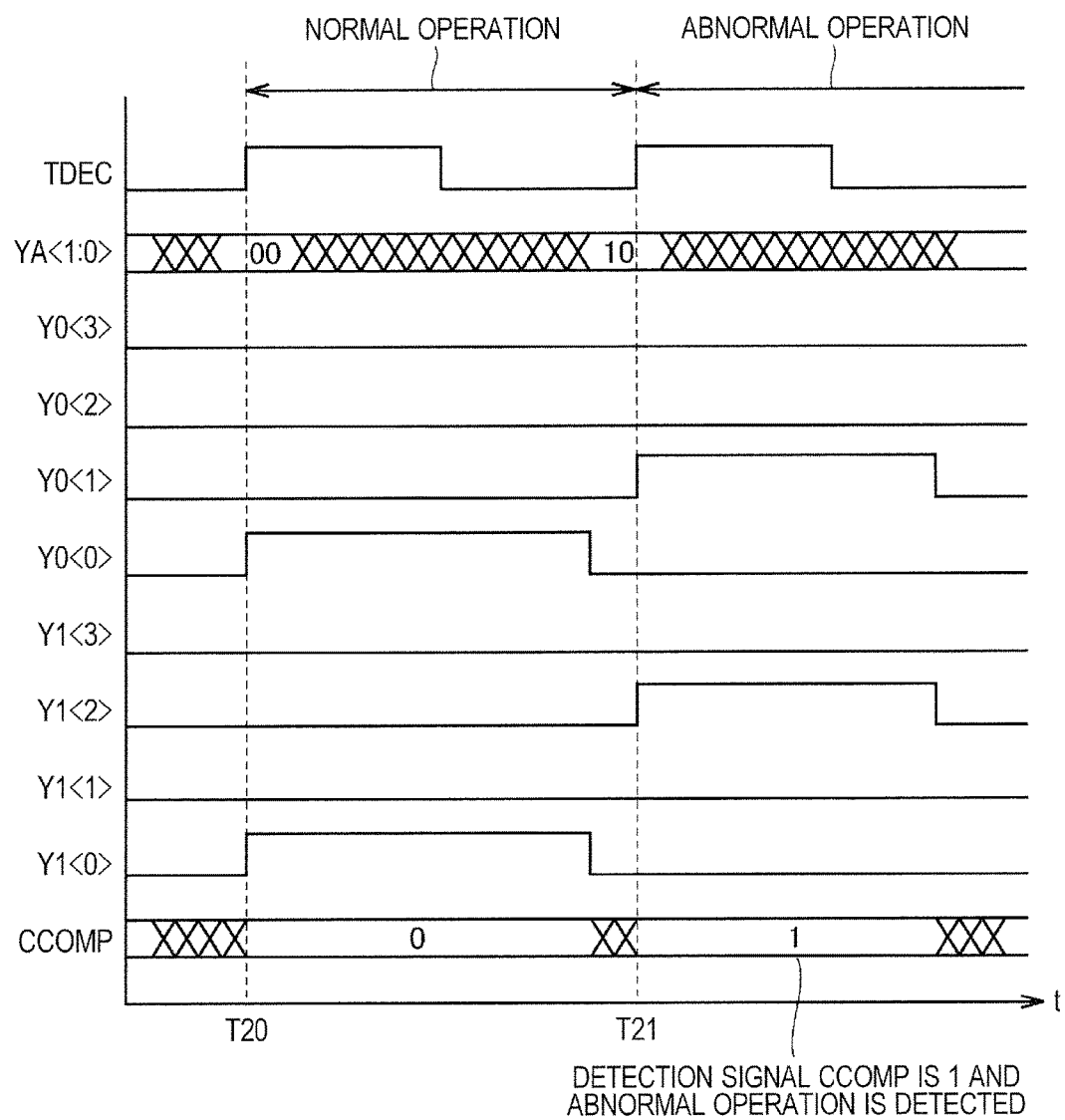
FIG. 8 is a timing chart showing the normal operation and abnormal operation of an address decoder of the semiconductor memory device according to the second embodiment.

FIG. 8 is a timing chart showing the normal operation and abnormal operation of the address decoder of the semiconductor memory device according to the second embodiment. In the present embodiment, the operation of the column decoders will be described.

As shown in FIG. 8, the semiconductor memory device operates in synchronization with the clock signal CLK. The latch circuit groups 43 and 43# latch the input of the column address data YA<1:0> in response to the rise of the internal clock signal TDEC. In the present embodiment, as an example, the internal clock signal TDEC rises at time T20.

The latch circuits 44 and 45 latch the input of the column address data YA<1>, YA<0> in synchronization with the rise of the internal clock signal TDEC. In the present embodiment, the input of "00" is latched as the column address data YA<1>, YA<0>.

Further, the latch circuits 44# and 45# latch the input of the column address data YA<1>, YA<0> in synchronization with the rise of the internal clock signal TDEC. In the present embodiment, the input of "00" is latched as the column address data YA<1>, YA<0>.

Then, the column decoder 18 generates the decode signals Y0<0> to Y0<3> based on the input of the column address data YA<1>, YA<0>. The present embodiment shows the case in which the decode signal Y0<0> is set to "1".

Further, the column decoder 18# generates the decode signals Y1<0> to Y1<3> based on the input of the column address data YA<1>, YA<0>. The present embodiment shows the case in which the decode signal Y1<0> is set to "1".

The comparison circuit 50 compares the decode signals Y0<0> to Y0<3> and the decode signals Y1<0> to Y1<3>, respectively. In this case they match, the comparison circuit 50 outputs the column determination output signal CCOMP ("0"). In this way, it is possible to detect normal operation of the column decoders.

Next, the internal clock signal TDEC rises at time T21. The latch circuits 44 and 45 latch the input of the column address data YA<1>, YA<0> in synchronization with the rise of the internal clock signal TDEC. In the present embodiment, the input of "10" is latched as the column address data YA<1>, YA<0>.

Further, the latch circuits 44# and 45# latch the input of the column address data YA<1>, YA<0> in synchronization with the rise of the internal clock signal TDEC. In the present embodiment, the input of "10" is latched as the column address data YA<1>, YA<0>.

Then, the column decoder 18 generates the decode signals Y0<0> to Y0<3> based on the input of the column address data YA<1>, YA<0>. The present embodiment shows the case in which the decode signal Y0<1> is set to "1".

Further, the column decoder 18# generates the decode signals Y1<0> to Y1<3> based on the input of the column address data YA<1>, YA<0>. The present embodiment shows the case in which the decode signal Y1<2> is set to "1".

The comparison circuit 50 compares the decode signals Y0<0> to Y0<3> and the decode signals Y1<0> to Y1<3>, respectively. In this case they do not match, so that the comparison circuit 50 outputs the column determination output signal CCOMP ("1"). In this way, it is possible to detect abnormal operation (failure) of the column decoders.

Thus, in the semiconductor memory device according to the second embodiment, it is possible to perform failure detection to determine whether the address decoder operates normally by a simple method of comparing the decode results of the column address signals from the column decoders.

Further, in the semiconductor memory device according to the second embodiment, it is possible to perform failure detection to determine whether the address decoder operates normally by comparing the decode signals both in data read and write.

Third Embodiment

In the third embodiment, a description will be made of the case in which the first and second embodiments are combined.

Figure 9:
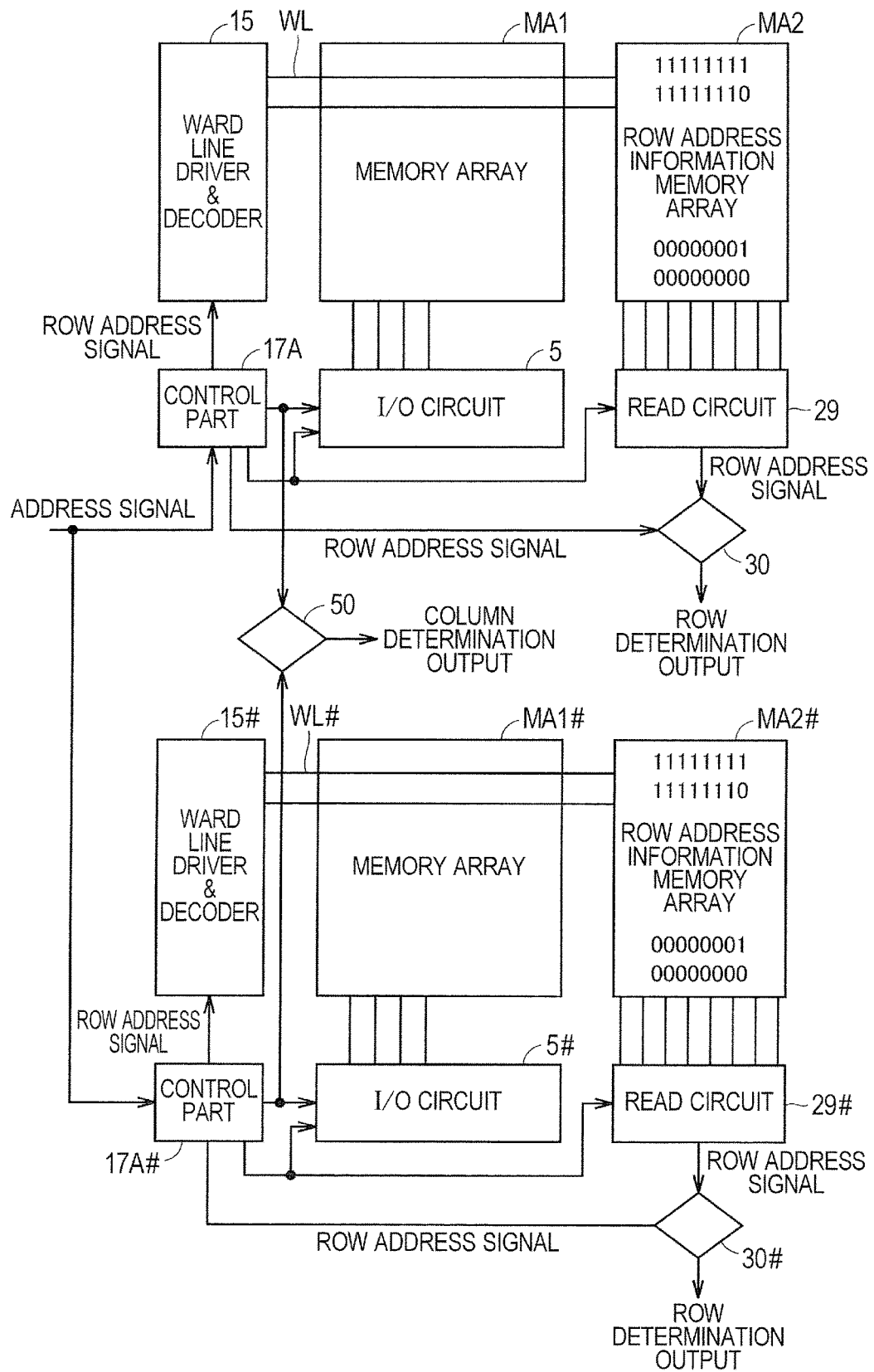
FIG. 9 is an overall block diagram of a semiconductor memory device according to a third embodiment.

FIG. 9 is an overall block diagram of a semiconductor memory device according to the third embodiment. Referring to FIG. 9, the difference in the semiconductor memory device according to the third embodiment is that memory arrays MA2, MA2#, read circuits 29, 29#, and comparison circuits 30, 30# are added, as compared to the semiconductor memory device shown in FIG. 6. Another difference is that the control parts 17, 17# are replaced by controls parts 17A, 17A#.

The other configurations are the same as the configurations described in FIG. 6, so that a detailed description thereof will not be repeated.

Each of the control parts 17A, 17A# also includes the latch circuits 20 to 23 configuring the control part 19 described in FIG. 2, as compared to each of the control parts 17, 17#. The latch circuits 20 to 23 are the same as those descried in FIG. 2, so that a detailed description thereof will not be repeated.

The memory arrays MA2, MA2# are provided respectively adjacent to the memory arrays MA1, MA1# in the column direction, and have memory cells arranged in matrix. The memory cells of the memory arrays MA2, MA2# are provided to be rewritable. The memory arrays MA2, MA2# are each configured in a read only memory.

In the present embodiment, the memory arrays MA2, MA2# store row address information used in the selection of the word line. More specifically, the memory cell of the memory cell row coupled to the word line previously stores the row address information used in the selection of the particular word line.

The read circuits 29, 29# read information stored in the memory arrays MA2, MA2#. In the present embodiment, the read circuits 29, 29# read the information stored in the memory cells of the memory arrays MA2, MA2# according to the selection of the word line WL, respectively.

The comparison circuit 30 compares the information read from the memory array MA2 with the row address information output from the control part 17A. The comparison circuit 30# compares the information read from the memory array MA2# with the row address information output from the control part 17#.

In the present embodiment, the row address information used in the selection of the word line is stored in the memory cells of the memory array MA2, MA2#.

Thus, similar to the comparison circuit described in the first embodiment, each of the comparison circuits 30, 30# compares two pieces of row address information and outputs the comparison result as the row determination output. More specifically, when the two pieces of row address information match, the row determination output is "0", and when they do not match, the row determination output is "1".

When the row address information for selecting the word line WL by the word line driver & decoder 15 matches the row address information read from the memory arrays MA2, MA2# ("0"), the decoders are normal.

On the other hand, when the row address information for selecting the word line WL by the word line driver & decoder 15 does not match the row address information read from the memory arrays MA2, MA2# ("1"), the decoders are abnormal.

Thus, in the semiconductor memory device according to the third embodiment, it is possible to perform failure detection to determine whether the row decoders operate normally, by a simple method of reading the address information stored in the memory arrays MA2, MA2# and comparing the input address information with the address information read from the memory arrays MA2, MA2#.

Further, it is also possible to perform failure detection to determine whether the column decoders operate normally by a simple method of comparing the decode results of the column address signals from the column decoders.

Further, in the semiconductor memory device according to the third embodiment, it is possible to perform failure detection to determine whether the address decoder operates normally by comparing the decode signals both in data read and write.

Note that the present embodiment has been described taking the SRAM memory as an example, but the present invention is not specifically limited to SRAM and can also be applied to other semiconductor memory devices in the same way.

The invention made by the present inventors has been concretely described based on the embodiments. However, it is needless to say that the present invention is not limited to the above embodiments and various modifications and alterations can be made within the scope of the present invention.

What is claimed is:

1. A semiconductor memory device comprising:
a first memory array having a plurality of first memory cells arranged in a matrix having a plurality of columns and a plurality of rows;
a second memory array adjacent to the first memory array and having a plurality of second memory cells, each second memory cell including a transistor having a source electrically connected to one of two predetermined voltages;
a plurality of word lines extending across the first memory array and the second memory array, each word line corresponding to one of the plurality of rows of the first memory array and electrically connected to a gate of a transistor of one of the plurality of second memory cells;
an address decoder configured to receive input address information and select a word line from the plurality of word lines based on the input address information, wherein a second memory cell of the plurality of second memory cells, a gate of a transistor of which is electrically connected to the selected word line, is turned on to enable the second memory cell to output one of the two predetermined voltages electrically connected to a source of the second memory cell to represent address information; and
a comparison circuit configured to compare the input address information with the address information read from the second memory array to determine whether the address decoder fails.

2. A semiconductor memory device according to claim 1, further comprising a latch circuit for latching the input address information,
wherein the comparison circuit compares the input address information latched by the latch circuit with the address information read from the second memory array.

3. A semiconductor memory device according to claim 1, wherein the comparison circuit compares the input address information with the address information read from the second memory array according to the word line selected in data write.

4. A semiconductor memory device comprising:
first and second memory arrays having a plurality of memory cells arranged in a matrix;
a plurality of first bit lines corresponding to each column of the first memory array;
a plurality of second bit lines corresponding to each column of the second memory array;
a first column address decoder configured to select a first bit line from the plurality of first bit lines based on input column address information;
a second column address decoder configured to select a second bit line from the plurality of second bit lines based on the input column address information; and
a comparison circuit configured to compare the decode results of the first and second column address decoders to determine whether the first and second column address decoder fail.

5. A semiconductor memory device according to claim 4, wherein the first and second column decoders are selected in response to a chip select signal.

6. A semiconductor memory device comprising:
a first memory array having a plurality of memory cells arranged in a matrix including a plurality of rows and a plurality of columns;
a plurality of first word lines corresponding to each of the plurality of rows of the first memory array;
a first row address decoder configured to select a first word line from the first word lines based on input row address information;
a second memory array adjacent to the first memory array, and with a plurality of second memory cells configured to read row address information used in the selection of the first word line stored in advance, according to the selected first word line extended to the second memory array;
a first comparison circuit configured to compare the input row address information with the row address information read from the second memory array to determine whether the first row address decoder fails;
a third memory array having a plurality of third memory cells arranged in matrix including a plurality of rows and a plurality of columns;
a plurality of second word lines corresponding to each of the plurality of rows of the third memory array;
a second row address decoder configured to operate with the first row address decoder in a complementary manner to select a second word line from the second word lines based on the input row address information;
a fourth memory array adjacent to the third memory, and with a plurality of fourth memory cells configured to read the row address information used in the selection of the second word line stored in advance, according to the selected second word line extended to the fourth memory array;
a second comparison circuit configured to compare the input row address information with the address information read from the fourth memory array to determine whether the second row address decoder fails;
a plurality of first bit lines corresponding to each column of the first and second memory arrays;
a plurality of second bit lines corresponding to each column of the third and fourth memory arrays;
a first column address decoder configured to select a first bit line from the plurality of first bit lines based on input column address information;
a second column address decoder configured to operate with the second column address decoder in a complementary manner to select a second bit line from the plurality of second bit lines based on the input column address information; and
a third comparison circuit configured to compare the decode results of the first and second column address decoders based on the input column address information to determine whether the first and second column address decoders fail.

* * * * *